(12) United States Patent
Kuo et al.

(10) Patent No.: US 8,516,400 B2
(45) Date of Patent: Aug. 20, 2013

(54) METHOD FOR PREDICTING TOLERABLE SPACING BETWEEN CONDUCTORS IN SEMICONDUCTOR PROCESS

(75) Inventors: Chien-Li Kuo, Hsinchu (TW); Wen-Jung Liao, Hsinchu (TW); Jiun-Hau Liao, Taipei County (TW); Min-Chin Hsieh, Hsinchu County (TW); Chun-Liang Hou, Hsinchu County (TW); Shuen-Cheng Lei, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 491 days.

(21) Appl. No.: 12/941,652

(22) Filed: Nov. 8, 2010

(65) Prior Publication Data
US 2012/0112782 A1    May 10, 2012

(51) Int. Cl.
*G06F 17/50*    (2006.01)

(52) U.S. Cl.
USPC ............... 716/51; 716/55; 716/56; 716/136

(58) Field of Classification Search
None
See application file for complete search history.

(56) References Cited

U.S. PATENT DOCUMENTS 7,135,344 B2 * 11/2006 Nehmadi et al. ............... 438/14
7,149,998 B2 * 12/2006 Li ................................... 716/53

* cited by examiner

*Primary Examiner* — Leigh Garbowski
(74) *Attorney, Agent, or Firm* — WPAT, PC; Justin King

(57) ABSTRACT

A method for predicting tolerable contact-to-gate spacing is provided. At first, a wafer with a plurality of source/drain contacts are provided. Then, a plurality of testing gate lines are formed on the wafer by using a photomask. In one die, there are different contact-to-gate distances ranging from $d+\Delta d$ to $d-\Delta d$ wherein d is the standard spacing and $\Delta d < d$. Then, the wafer is inspected to find failure counts corresponding to each contact-to-gate distance. The tolerable spacing is determined according to the failure counts and the contact-to-gate distances based on a statistical method.

20 Claims, 4 Drawing Sheets

METHOD FOR PREDICTING TOLERABLE SPACING BETWEEN CONDUCTORS IN SEMICONDUCTOR PROCESS

FIELD OF THE INVENTION

The present invention relates to a method for predicting tolerable spacing of conductors in a semiconductor process, and more particularly to a method for predicting tolerable spacing of conductors to avoid short between the conductors due to misalignment in the semiconductor process.

BACKGROUND OF THE INVENTION

With development in semiconductor technologies, size of semiconductor products reduces progressively. Therefore, it is an inevitable trend that the spacing between components in many semiconductor devices is highly limited. However, when the conductors are formed too close, there are adverse effects, for example, short or inductive coupling which seriously affects the performance of the semiconductor devices.

Please refer to FIGS. 1A and 1B respectively illustrating a top view and a cross-sectional view along line A-A of a typical metal-oxide-semiconductor field-effect transistor (MOSFET) structure. The MOSFET structure 1 includes a substrate 10. After several processing steps performed on the substrate 10 such as deposition, patterning and ion-implantation steps, a gate line 11, source/drain regions 12 and 13, and a gate insulating layer 14 are formed. Two contacts 121 and 131, namely source/drain electrodes, are provided on the source/drain regions 12 and 13 to be electrically connected to outer components through wires. The distances between the gate line 11 and the contacts 12 and 13 should be longer than a nominal spacing to avoid short. Since the distance is quite shorter, the accuracy for forming the gate line 11 and the source/drain regions 12 and 13 is critical. However, it is almost impossible to require that a patterning equipment has 100% alignment accuracy without any deviation in nanometer scales. Hence, while processing wafers, the equipment error should be taken into consideration, and the practical distance is not exactly the same as the nominal spacing. How to predict tolerable spacing between conductors is important to both limit the total size of the semiconductor device and avoid reducing product yield rate.

To make the prediction, operators usually collect lots of experimental data and then determine the tolerable spacing according to the experimental data in a quiet intuitive manner. At first, the standard steps of forming a plurality of source/drain regions and the source/drain contacts are carried out on a wafer. Next, moving a photomask, used for patterning and forming the polysilicon gate lines, and a lithography process are repeatedly executed through the entire wafer to transfer the pattern to a photoresist layer provided on a polysilicon layer which will be patterned to from the polysilicon gate lines later. In this step, the photomask is progressively shifted from predetermined positions to various deviated positions towards or away from the source/drain contacts. In other words, various little deviation is intentionally introduced in this step. For example, first deviation is introduced in a first lithography process, second deviation is introduced in a second lithography process and so on. After the formation of the gate lines 11 with different deviations, an electron beam inspection (EBI) system capable of detecting electrical defects such as a short or a leakage defect by detecting bright voltage contrast (BVC) is utilized to find failure count for each deviation.

Please refer to FIG. 2 illustrating a plot of failure count vs. deviation of the photomask. It is found that in a safe window, the failure count (amount) is within an acceptable range. Hence, the operator should control the deviation within the safe window in subsequent normal production. It is to be noted that the plot is not symmetrical about zero deviation due to alignment error. Hence, it is possible that the optimum position of the photomask is not the predetermined position. The acceptable position or the optimum position of the photomask, which may be deviated from the predetermined position, is thus obtained from the determined safe windows.

However, the safe window is determined by operators by visual analysis without scientific base. Different operators may obtain different prediction results. Furthermore, the prediction result cannot be scaled up or down even for the same patterning equipment. The inspection system has to scan all the die area. For example, 1 MB static random access memory (SRAM) density per die means total 1,048,576 (1,024*1,024) scan counts per die. It is really time-consuming for the inspection, and the entire process including determining the safe window to adjust position parameters of the photomask is uncompetitive. Hence, there is a need of providing an improved method for predicting the tolerable spacing between conductors in semiconductor device to overcome the problems encountered in the prior art.

SUMMARY OF THE INVENTION

The present invention provides a method for predicting tolerable spacing between conductors in a semiconductor structure. The prediction is made based on a statistical method by a dedicated hardware or computer software to provide a systematic prediction.

The present invention also provides a method for predicting tolerable spacing between conductors in a semiconductor structure by inspecting a die with fewer conductors.

In accordance with an aspect of the present invention, the prediction method includes the following steps. A wafer with a first normal conductor and a plurality of first testing conductors formed thereon is provided at first. A photomask with a plurality of strip patterns is used for forming a second normal conductor and a plurality of second testing conductors on the wafer. In one die, there is a distance d between the first normal conductor and the second normal conductor, and there are distances $d_i$ between the first testing conductors and the second testing conductors, in which, $d_i$ are different values ranging from $d+\Delta d$ to $d-\Delta d$ and $\Delta d < d$. After the second testing conductors are formed, the die is inspected to obtain an inspecting result. The tolerable spacing between the first conductor and the second conductor is predicted according to the inspecting result and the distances $d_i$.

In accordance with another aspect of the present invention, the prediction method includes the following steps. A wafer with a plurality of first conductors formed thereon is provided at first. A photomask with a plurality of strip patterns is used for forming a plurality of second conductors on the wafer. In one die, there are different distances $<d_i>$ between the second conductors and the first conductors. Then, the die is inspected to find a relation (standard deviation) between failure counts and the distances from a regression line through a distance-failure count plot. The tolerable spacing between the first conductor and the second conductor is predicted according to the standard deviation to meet a predetermined acceptable failure count.

BRIEF DESCRIPTION OF THE DRAWINGS

The above objects and advantages of the present invention will become more readily apparent to those ordinarily skilled in the art after reviewing the following detailed description and the accompanying drawings, in which.

DETAILED DESCRIPTION OF THE PREFERRED EMBODIMENT

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

The present invention eliminates the step of shifting photomask to form gate lines deviating from the predetermined position. In stead, a plurality of strip patterns for forming testing gate lines are provided on the photomask. After the formation of the source/drain contacts, the testing gate lines are formed by steps of forming a conductive layer on the wafer and patterning the conductive layer by using the photomask to form the testing gate lines corresponding to the strip patterns. In fact, the so-called patterning step includes several sub-steps such as mask layer formation, photoresist formation, lithographing process, etching process, and other necessary processes, while the redundant detail is not given herein. It is to be noted that the strip patterns are arranged to make the testing gate lines to deviate from predetermined positions with different deviations. In other words, the distances between the testing gate lines and their adjacent contacts are not identical. For example, if the standard contact-to-poly distance is d, the deviations may be $\Delta d_1$, $\Delta d_2$, $\Delta d_3$ ..., and thus the contact-to-poly distances $d_1=d-\Delta d_1$ (or $d+\Delta d_1$), $d_2=d-\Delta d_2$ (or $d+\Delta d_2$), $d_3=d-\Delta d_3$ (or $d+\Delta d_3$), ....

Figure 1A:
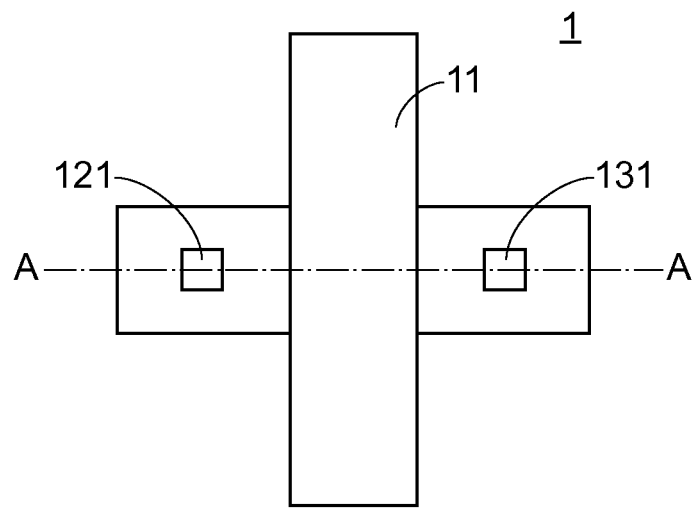
FIG. 1A is a top view illustrating a typical MOSFET structure.
Figure 1B:
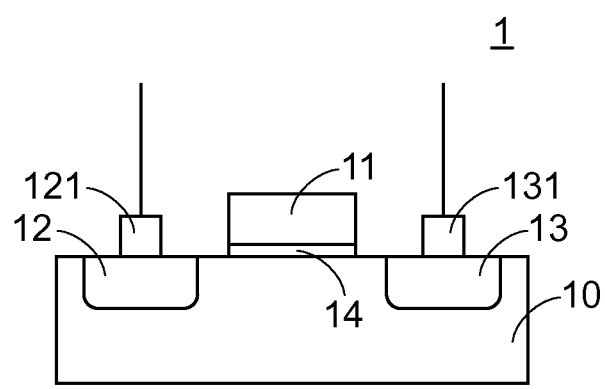
FIG. 1B is a cross-sectional view along line A-A of the MOSFET structure in FIG. 1A.
Figure 2:
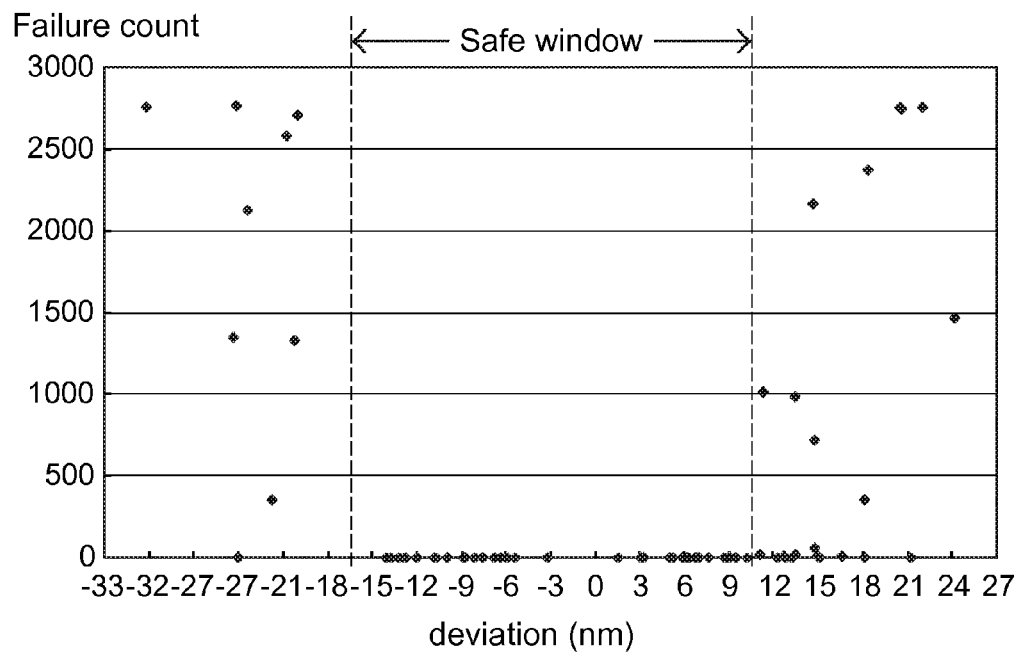
FIG. 2 illustrates a plot of failure count vs. deviation of a photomask used for forming gate lines of the MOSFET structure.
Figure 3:
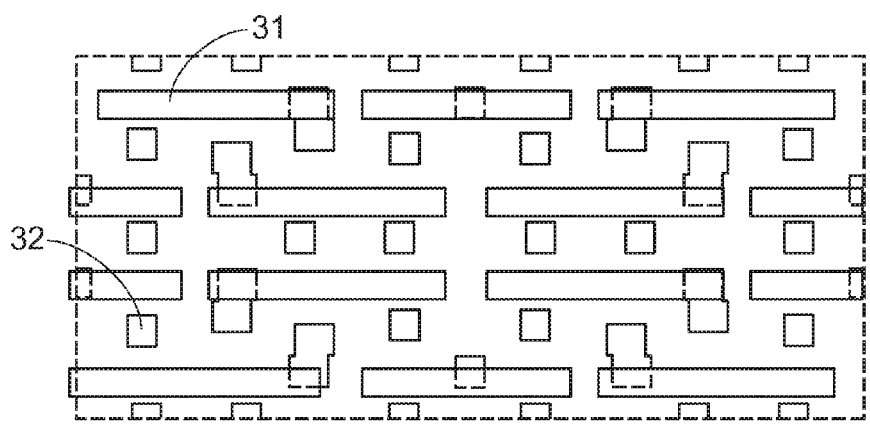
FIG. 3 is a schematic diagram illustrating a portion of a wafer formed thereon a plurality of source/drain contacts and testing gate lines formed by using a photomask having strip patterns according to a preferred embodiment of the present invention.

Hence, the photomask with the strip patterns achieve the function of shifting the photomask as described in the prior art. Please refer to FIG. 3 illustrating a portion of a wafer formed thereon a plurality of source/drain contacts 32 and the testing gate lines 31 formed by using the photomask having the strip patterns according to the present invention. Therefore, without shifting the photomask, the layout already includes different contact-to-gate distances in one die. The die is then examined by an EBI system to find failure amount.

Taking an example of 32 nm—SRAM process, the distribution of the contact-to-gate distances may cover the spacing range (i.e., 32 nm). The possible deviation may include 5, 8, 11, 14, 17, 20, 23, 26, 29 and 32 nm. Hence, the plurality of strip patterns on the photomask may results in the contact-to-gate distances $<d_i>$ of 27, 24, 21, 18, 15, 12, 9, 6, 3 and 0 nm in an ideal condition. It is to be noted that the listed contact-to-gate distances and the amount of the strip patterns are not limited and can be varied or adjusted according to the production requirements or conditions.

In an embodiment, the plurality of strip patterns are considered as a pattern group, and the photomask may include repeated pattern groups. Therefore, more data can be collected to increase the population to be analyzed to obtain more precise estimation. There is no particular limit to the amount of the repeated pattern groups. Since much time is needed to examine a larger area of the wafer, the operator may determine a proper amount of the repeated pattern groups provided on the photomask. Besides, the photomask can be slightly shifted from the predetermined position to several shifted positions in different directions to get more data about failure count vs. deviation.

Figure 4:
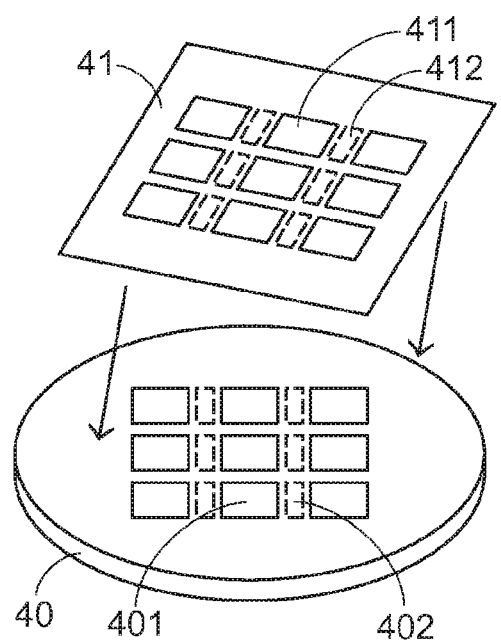
FIG. 4 is a schematic diagram illustrating a plurality of strip patterns provided on a specific area of a photomask according to another preferred embodiment of the present invention.

In an embodiment, the plurality of strip patterns or pattern groups 412 are provided on an unused area of the photomask 41 as shown in FIG. 4. The photomask 41 provides normal patterns 411 in a main area and maybe 80-90 testing dice of strip patterns or pattern groups 412 in the unused area. Therefore, the normal conductors, corresponding to the normal patterns 411, are formed at a main area 401 of the wafer 40, while the testing gate lines, corresponding to the strip patterns 412, are formed at an unused area 402 of the wafer 40. Therefore, the testing gate lines may be formed during the normal manufacturing procedure, but does not affect the normal manufacturing procedure because the unused area 402 will be cut off eventually. Hence, no additional dummy cycle is needed for forming the testing gate lines.

To predict the acceptable position of the photomask, the collected data are analyzed by a statistical method. Table 1 shows experimental data after the EBI examination for a die on which the testing gate lines and the source/drain contacts are formed.

TABLE 1

Experimental data after EBI examination

| Inspection count | Deviation $\Delta d$(nm) | Contact-to-gate distance (nm) | Failure count |
|---|---|---|---|
| 19200 | 3.25 | 28.75 | 0 |
| 19200 | 5.95 | 26.05 | 0 |
| 19200 | 10.56 | 21.44 | 0 |
| 19200 | 13.26 | 18.74 | 0 |
| 19200 | 12.84 | 19.16 | 0 |
| 19200 | 15.54 | 16.46 | 1 |
| 19200 | 15.96 | 16.04 | 4 |
| 19200 | 18.24 | 13.76 | 20 |
| 19200 | 18.66 | 13.34 | 62 |
| 19200 | 20.94 | 11.06 | 339 |

According to the experimental data, failure possibility for each contact-to-gate distance is obtained. The plot of failure possibility vs. contact-to-gate distance will show a possibility distribution. The possibility distribution is normalized to obtain a normal distribution curve if the population is large enough. The manufacturer may establish an acceptable failure possibility, for example 1%. Then, the operator may decide the acceptable spacing from the normal distribution curve according to the acceptable failure possibility, i.e. finding the contact-to-gate distance corresponding to 1% failure possibility in the normal distribution curve in this example. By this way, the tolerable spacing is determined based on a fixed standard and does not intuitively determined any more. Moreover, the determination and analysis may be automatically made by dedicated hardware or software without human decision. It may significantly reduce subjective judgment which is improper in precision process.

Figure 5:
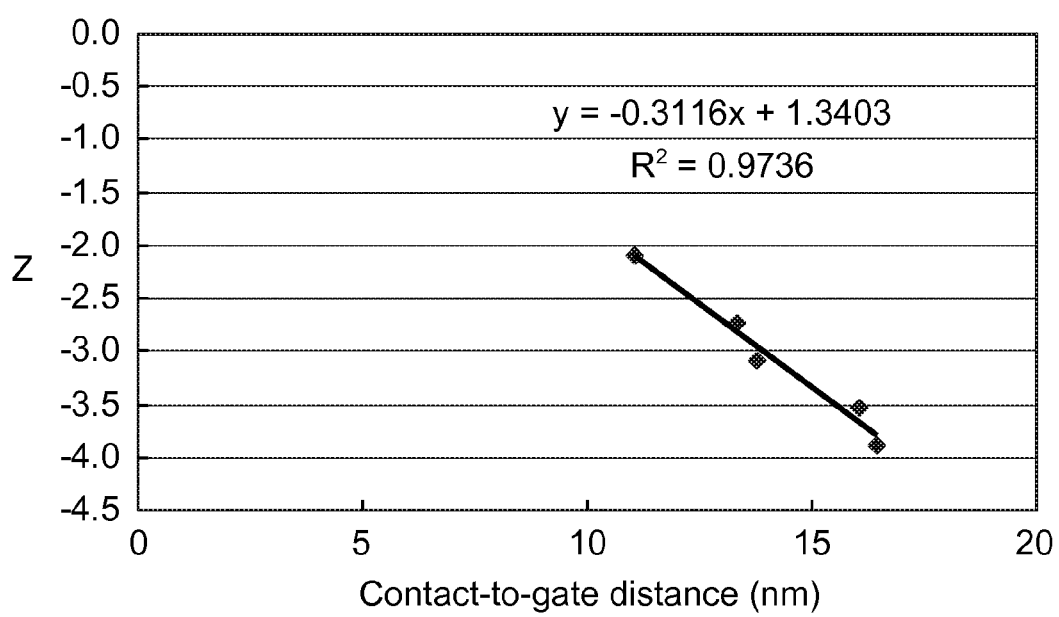
FIG. 5 shows a plot of Z-value vs. contact-to-gate distance according to experimental data obtained by the method according to the present invention.

Furthermore, a plot of Z-value vs. contact-to-gate distance can be obtained according to the normal distribution curve or the experimental data listed in Table 1. In definition, Z=NORMSINV(Failure count/Inspection count), for example, Z_11.06=NORMSINV(339/19200)=−2.1. Please refer to FIG. 5 showing the plot. Based on statistical theory, the slope of line about Z-value vs. contact-to-gate distance should be a negative reciprocal of standard deviation σ. Accordingly, the standard deviation σ can be derived by linear regression through the data associated with the contact-to-gate distances and the Z-values. In this embodiment, the slop of the regression line shown in FIG. 5 is −0.3116, and the standard deviation σ is 3.21.

It is to be noted that the standard deviation of a specific patterning equipment is a constant even for different scale process. Hence, the obtained standard deviation σ may be used to predict acceptable contact-to-gate distance for other SRAM density in one die. The tolerable contact-to-poly spacing is calculated from n×σ, where n may be an integer or not. Please refer to TABLE 2 showing the relation between the spacing and cumulative failure probability derived from a normal distribution.

TABLE 2

Relation between the spacing and cumulative failure probability

| Spacing | Cumulative failure probability (%) |
|---|---|
| 8σ | 0.0000000000001 |
| 7σ | 0.0000000001288 |
| 6σ | 0.0000000990122 |
| 5σ | 0.0000287105000 |
| 4σ | 0.0031686034609 |
| 3σ | 0.1349967223235 |
| 2σ | 2.2750062036187 |
| 1σ | 15.8655259758996 |
| 0 | 49.9999999781721 |

When the tolerable spacing is 3σ, i.e. 9.63 nm, the cumulative failure probability is 0.1349967223235%. It means that 1 failure may occur in every one thousand counts. If the total count increases to one billion and 1 failure is acceptable, the tolerable spacing increases to about 6σ. The contact-to-poly spacing can not shorter than 6σ, i.e. 19.26 nm. Hence, the tolerable contact-to-poly spacing for different die scale may be determined or calculated according to the obtained standard deviation and the acceptable failure count.

Figure 6:
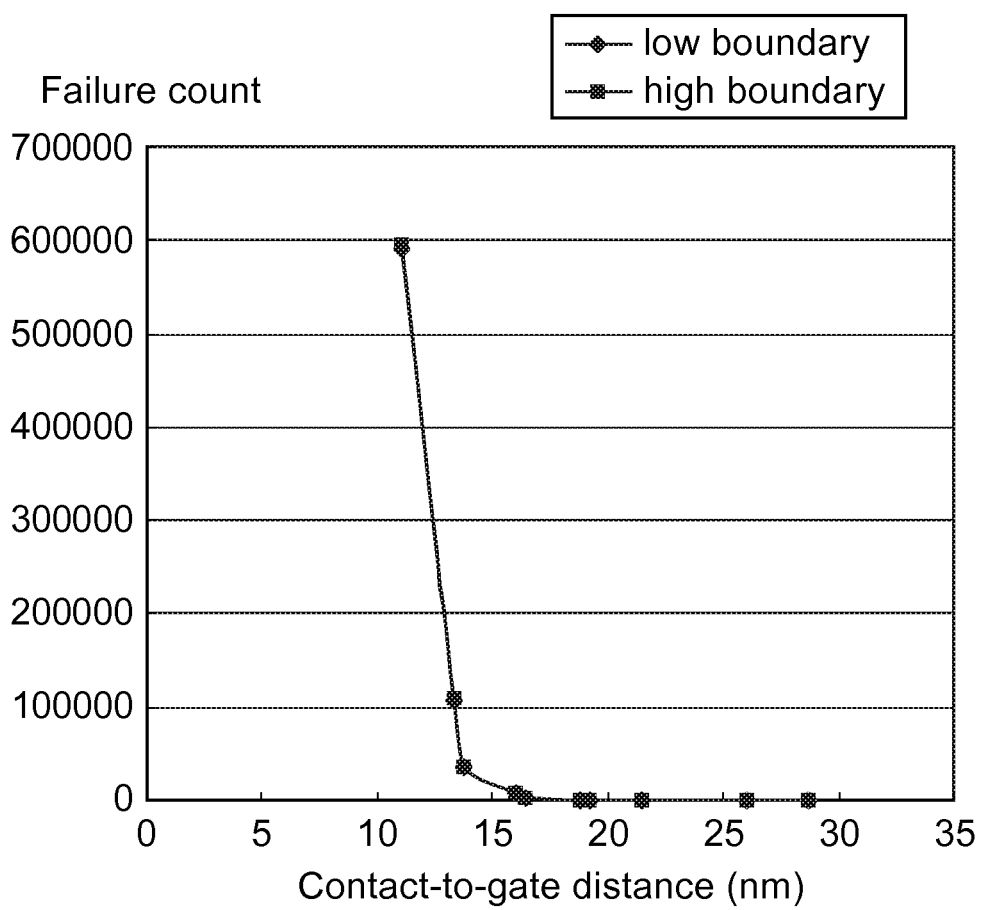
FIG. 6 shows a plot of predicted failure count vs. contact-to-gate distances at 99% confidence level.

For comparison, the experimental data in TABLE 1 includes total scan counts of 19.2K×10 in one die. The standard deviation can be applied to prediction for 1 MB SRAM density in one die. According to the prior arts, 1,048,576 scan counts are required. Thus, 70% of the scan time of EBI examination is saved. Furthermore, the prediction result can be even applied to 32 MB SRAM density per die. FIG. 6 shows the predicted failure counts for different contact-to-gate distances at 99% confidence level for 32 MB SRAM density per die. These predicted failure counts are derived from the experimental data in TABLE 1, rather than time-consuming EBI scan for the 32M SRAM dies. Hence, as long as enough population is collected, the failure counts can be well predicted without actually manufacturing and inspecting the SRAM dies. Thus, the process of forming the testing die or the related inspection process can be partially or fully omitted.

Modification can be made to the present invention. For example, the present method can be applied to predicting tolerable spacing between conductors in semiconductor structure, not only limited to contact-to-gate spacing. So-called conductors may be made of metal, alloy or polysilicon with or without impurities. Furthermore, the step of inspecting failure in the wafer to get failure count in dies can be detected by any detection system which is capable of detecting electrical defect such as short. The patterning equipment includes any equipment involved with lithography process which can precisely define processing area on wafer.

In conclusion, the present invention provides a rigorous method for predicting tolerable spacing between conductors or tolerable deviation of misaligning photomask. The prediction uses statistical method to analyze the collected data. Compared to the human decision in the prior art, the prediction may be made by dedicated hardware or computer program in a more efficient and accurate manner. Furthermore, the prediction can be scaled up for similar process to significantly reduce the inspection time required for higher density process in prior arts. Hence, the present invention provides an effective and systematic prediction method compared with the conventional spacing prediction method.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method for predicting tolerable spacing between conductors, comprising steps of:
    providing a wafer with a first normal conductor and a plurality of first testing conductors thereon;
    using a photomask with a plurality of strip patterns to form a second normal conductor and a plurality of second testing conductors on the wafer, wherein in one die, there is a distance d between the first normal conductor and the second normal conductor, and there is a distance $d_i$ between one of the first testing conductor and a corresponding one of the second testing conductor, in which, i is an individual integer, $d_i$ are different values ranging from d+Δd to d−Δd, and Δd<d; and
    inspecting the die to obtain an inspecting result and predicting the tolerable spacing between the first testing conductor and the second testing conductor according to the inspecting result and the distances $d_i$.

2. The method according to claim 1 wherein the first normal conductor and the first testing conductors are source/drain contacts, and the second normal conductor and the second testing conductors are gate lines.

3. The method according to claim 2 wherein the gate lines are polysilicon gate lines.

4. The method according to claim 1 wherein the die including the first normal conductor, the first testing conductors, the second normal conductor, and the second testing conductors is formed on an unused area of the wafer.

5. The method according to claim 1 wherein before the step of forming the second conductors, the method further comprises a step of shifting the photomask from a predetermined position so as to form deviated second conductors.

6. The method according to claim 1 wherein the step of inspecting the die to obtain the inspecting result comprising steps of:
detecting electrical short between the first testing conductors and the second testing conductors in the die; and
counting the electrical short to obtain failure counts for each distance $d_i$.

7. The method according to claim 6 wherein the step of inspecting the die is performed by an electron beam inspection system.

8. The method according to claim 1 wherein the step of predicting the tolerable spacing comprising steps of:
establishing a normal distribution curve associated with the failure counts and the distances $d_i$;
defining an acceptable failure possibility; and
calculating the tolerable spacing according to the normal distribution curve and the acceptable failure possibility.

9. The method according to claim 8 wherein the tolerable spacing is $n \times \sigma$, in which n is an integer determined according to the acceptable failure possibility and $\sigma$ is a standard deviation of the normal distribution.

10. The method according to claim 8 wherein the step of predicting the tolerable spacing is performed by a dedicated hardware or computer software.

11. A method for predicting tolerable spacing between conductors, comprising steps of:
providing a wafer with a plurality of first conductors thereon;
using a photomask with a plurality of strip patterns to form a plurality of second conductors on the wafer, wherein there are different distances $<d_i>$ between the second conductors and corresponding first conductors in one die on the wafer, where i is an integer;
inspecting the die to find a relation between failure counts and the distances, and obtaining a standard deviation from the relation; and
predicting the tolerable spacing between the first conductor and the second conductor according to the standard deviation to meet a predetermined acceptable failure count.

12. The method according to claim 11 wherein the first conductors are source/drain contacts and the second conductors are testing gate lines.

13. The method according to claim 12 wherein the testing gate lines are polysilicon gate lines.

14. The method according to claim 11 wherein before the step of forming the second conductors, the method further comprises a step of shifting the photomask from a predetermined position so as to form deviated second conductors.

15. The method according to claim 11 wherein the step of inspecting the die comprising steps of:
detecting electrical short between the first conductors and the second conductors in the die; and
counting the electrical short to obtain the failure counts for each distance $d_i$.

16. The method according to claim 15 wherein the step of inspecting the die is preformed by an electron beam inspection system.

17. The method according to claim 11 wherein the step of finding the relation between the failure counts and the distances comprising steps of:
obtaining a regression line through the failure counts and the corresponding distances;
calculating the slope of the regression line; and
calculating the standard deviation according to the slop.

18. The method according to claim 17 wherein the tolerable spacing is $n \times \sigma$, in which n is an integer determined according to the predetermined acceptable failure count, and $\sigma$ is the standard deviation.

19. The method according to claim 18 wherein the tolerable spacing increases when the amount of the first and the second conductors in one die increases.

20. The method according to claim 18 wherein the step of predicting the tolerable spacing is performed by a dedicated hardware or computer software.

* * * * *